(12) United States Patent
Langheinrich

(10) Patent No.: US 6,887,113 B1
(45) Date of Patent: May 3, 2005

(54) CONTACT ELEMENT FOR USE IN ELECTROPLATING

(75) Inventor: Peter Langheinrich, Feucht (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 09/762,759

(22) PCT Filed: Jul. 13, 1999

(86) PCT No.: PCT/DE99/02187

§ 371 (c)(1),
(2), (4) Date: Feb. 9, 2001

(87) PCT Pub. No.: WO00/11679

PCT Pub. Date: Mar. 2, 2000

(51) Int. Cl.⁷ .............................................. C25B 9/09
(52) U.S. Cl. ................. 439/822; 200/279; 204/297.14
(58) Field of Search .......................... 200/279; 439/822, 439/729; 204/285, 297.14, 297.13, 297.15, 297.1, 297.09, 297.08, 297.07

(56) References Cited

U.S. PATENT DOCUMENTS

| | | | | |
|---|---|---|---|---|
| 2,248,718 A | * | 7/1941 | Owen ..................... | 204/297.14 |
| 2,339,996 A | * | 1/1944 | Kight ........................ | 200/19.3 |
| 4,085,997 A | * | 4/1978 | Hainsworth ............ | 204/297.14 |
| 4,385,967 A | | 5/1983 | Brady et al. ................ | 205/145 |
| 4,755,271 A | | 7/1988 | Hosten ....................... | 204/198 |
| 4,767,146 A | | 8/1988 | Haase ......................... | 294/104 |
| 4,776,939 A | | 10/1988 | Blasing et al. .............. | 204/202 |
| 4,879,007 A | | 11/1989 | Wong .......................... | 205/137 |
| 5,391,276 A | | 2/1995 | Astor et al. .................. | 204/198 |
| 5,401,370 A | | 3/1995 | Kauper et al. ............ | 204/228.2 |
| 5,456,814 A | * | 10/1995 | Metzka ..................... | 204/297.1 |
| 5,901,997 A | * | 5/1999 | Bayer | |

FOREIGN PATENT DOCUMENTS

| | | | |
|---|---|---|---|
| DE | 25 12 762 | | 9/1976 |
| DE | 30 27 751 C2 | | 2/1982 |
| DE | 32 36 545 | | 5/1983 |
| DE | 36 24 481 | | 1/1988 |
| DE | 36 45 319 | | 1/1988 |
| DE | 37 26 571 C1 | | 3/1989 |
| DE | 40 05 209 | | 8/1991 |
| DE | 41 06 733 C2 | | 9/1992 |
| DE | 29721741 | * | 4/1998 |
| EP | 0 254 962 | | 7/1987 |
| EP | 0 578 699 | | 4/1992 |
| WO | PCT/EP97/01544 | | 3/1997 |
| WO | PCT/CA97/00350 | | 5/1997 |
| WO | WO 97/46740 | | 12/1997 |
| WO | PCT/DE98/03477 | | 11/1998 |

* cited by examiner

*Primary Examiner*—Neil Abrams
(74) *Attorney, Agent, or Firm*—Paul & Paul

(57) ABSTRACT

It is difficult to transmit large processing current on the surfaces of printed circuit boards (L) using clamp-type contact organs (6, 7). In order to solve said problem, contact elements (15, 16) having one or more contact surfaces (26) are disposed on the contact organs (6, 7). The shape of the contact surfaces (26) are configured in such a way that no damages occur in the areas of the conductive surfaces adjacent to the contact surfaces (26) when large currents are transmitted from the contact elements (15, 16) printed on the electrically conductive surface of printed board material (L) on the contact surfaces to the conductive surface.

15 Claims, 5 Drawing Sheets

CONTACT ELEMENT FOR USE IN ELECTROPLATING

BACKGROUND OF THE INVENTION

1. Field of the Invention

The invention relates to a contact element for supplying electric current to substantially board-shaped objects that are to be treated by an electrolytic process.

2. Brief Description of the Related Art

To submit objects to an electrolytic treatment, they have to be transported and placed in electric contact in order for them to be supplied with electric current while being in contact with a liquid for treatment.

Various appliances are used to serve this purpose. U.S. Pat. No. 4,767,146 for example discloses holding tongs for printed circuit boards which comprise two legs provided each with two gripping arms. On account of the force of a spring, the legs with the gripping arms are pivotal about an upper axis, the lower ends being thus pushed together. The lower ends of the gripping arms are provided with teeth. The arms of the one leg are provided with two tooth-like projections each and the arms of the other leg with one tooth-like projection each.

This contacting and holding appliance is used in conventional electrolytic tank plants in which the printed circuit boards are vertically held and dipped into the tank.

Another method consists in conveying the objects through the various processing stations in horizontal direction.

DE 25 12 762 B2 suggests using electrical contact springs for contacting objects to be chromium-plated that are fastened on work holding fixtures. For this purpose, the objects are clamped in the contact springs which are formed by two springable bars.

For some time past, employment has been made of coating lines for the electrolytic treatment of board-shaped objects, in particular for printed circuit boards, the boards being transported through said coating plants in horizontal direction. For this purpose the boards are contacted with the liquid for treatment, with a galvanizing bath or with a solution suitable for electrolytic pickling for example. In order to allow electric current to be supplied to the boards, appropriate contact elements are provided. The boards are moreover led through the plant by conveying facilities.

Furthermore, WO 97/37062 A1 describes a device for the electrochemical processing of electrically conductive areas which are insulated against each other on printed circuit boards. To make electrical contact with these areas, brushes are used, whose thin conductive fibers make electrical contact with the structured surfaces to be treated. The printed circuit boards are guided past the stationary brushes in horizontal direction and in horizontal orientation so that the tips of the brushes graze the surfaces. This device is not suited for transmitting large electric currents to the printed circuit boards. It is also difficult to find a solution for practical operation that, on one hand, provides the brushes with a long working life and that, on the other hand, protects the surfaces of the printed circuit boards against damage.

DE 36 45 319 C2 discloses an array for the electrolytic treatment of board-shaped objects such as printed circuits. In this array, the printed circuits are conveyed in horizontal direction and in horizontal orientation while being held by clamps which are used as conveying and contacting facilities. The clamps each consist of two bars which, under the pressure of the spring; are pivoted about their mutual, electrically conductive connecting or contacting point in such a manner that their lower ends are pushed against one another, thus grasping the side edge (galvanoedge) of the printed circuit boards. In practice, the width of the edge amounts to 10 to 15 mm. Each printed circuit board is typically contacted on at least one side by way of several clamps.

In practical operation, the flow of current is progressively increased in these plants in order to accelerate the electrolytic treatment of printed circuit boards. Nowadays, typical values for the flow of current already range from 20 to 80 A for every printed circuit side and clamping contact when the distance between the clamps amounts to 60 mm for example. The currents supplied to one whole printed circuit side by means of several clamps are considerably larger.

If, for the electrolytic treatment of printed circuit boards coated with copper on both sides, clamps that grasp both sides and supply electric contact are used, one such clamp carries 40 to 160 A. Such large currents are difficult to be transmitted onto the thin conductive base coating of the boards. Large currents cause the metal ions in the vicinity of the contacts to deplete in the electrolyte so that the deposited coating of metal scorches in the neighborhood of the contacting spots on the printed circuit boards (=formation of metal coatings with a granular crystal structure).

It has also been observed that the occurrence of the presented phenomena increases when a base coating of copper having a reduced coating thickness is electroplated. For various reasons it is necessary to reduce the coating thickness from hitherto 17 $\mu$m to at present 6 $\mu$m and even to 0.7 $\mu$m for example (when using certain manufacturing techniques [SBU-technique=Sequential-Build-Up], e.g., when fine bores (100 $\mu$m and less) must be drilled with laser light or in order to avoid undercut when thicker base coatings of copper are used, as well as for reasons of material saving and to optimize the electric properties of the boards.

These increasing demands placed on the modern fabrication of printed circuits are no longer to be met with the devices of the art. The base coatings of copper proved to "scorch" on the contacting spots and in the adjacent regions thereof on the surfaces of the printed circuit boards. This means that large black spots form at these places, where the copper coating is damaged or in parts even completely destroyed. These damages or destructions are in parts limited to the areas in which no strip conductor structures are intended to be formed on the printed circuit material. However, these damaged spots are often so large that the border areas of the strip conductor structure are damaged as well. In this case, the processed board has necessarily to be scrapped. What is particularly disturbing with these scorched spots is that the residues of scorching (fine oxidized copper) are in parts lying loose on the board and are distributed by the flow of the electrolyte over the surface of the board where they are incorporated in the coating on deposition of the metal. As a result, the board is rendered unsuitable for use.

For reasons of economy, the width for the galvanoedge is desired to be steadily reduced while the current density should increase and the thickness of the base layer of copper be lowered, which entails the above mentioned problems.

The basic problem of the invention is therefore to avoid the drawbacks of the devices and methods of the art and in particular to advance means for achieving a satisfactory electrolytic treatment utilizing very large currents while potential impairments of the metal coating on the surface of the board are merely tolerated in a very narrow border area and the above mentioned requirements can be met even on using very thin layers of copper on the boards.

The solution of the problems indicated herein above is given by the contact element, the contact organ and the method of supplying electric current according to the present invention.

SUMMARY OF THE INVENTION

The invention relates to a contact element for supplying electric current to substantially board-shaped objects that are to be treated by an electrolytic process and to a contact organ for said objects which comprises at least one stem and at least one contact element, the at least one contact element being arranged at one end of the stem which is bent at an angle of about 90° and the stem being movable together with the contact element by means of a restoring force so that the contact element can be pushed onto the objects. The invention also relates to a method of supplying electric current to the objects. The contact organ is specifically used in electrochemical processing plants.

The contact element serves for supplying electric current to objects which are substantially shaped like boards, such as printed circuit boards, and which are intended to be submitted to an electrolytic treatment in so-called horizontal plants in which the printed circuit boards are conveyed in horizontal direction and are oriented either substantially horizontally or substantially vertically. The electrolytic processes of interest are electrolytic metal deposition and electrolytic pickling as well as other types of electrolytic processes such as for example electrolytic purification.

The contact element is provided with one or more contact areas, the shape of the contact areas being configured in such a way that no damages occur in the areas of the copper surface adjacent to the contact areas when large currents are transmitted from the contact element printed on the contact areas on the electrically conductive surface to the copper surface. The large currents may be transmitted to copper surfaces of printed board materials as well as to surfaces made from tin, tin-lead alloy or from another electrically conductive material.

The contact organ according to the invention is provided with at least one stem and with at least one contact element. The contact element is arranged at one end of the stem. The end of the stem may be bent at an angle of about 90° with respect to the stem. The orientation of the stem may also be straight. The stem is movable with the contact element by way of a restoring force in such a way that it may be printed onto the surface of the objects. In a preferred embodiment, the contact organ consists of two such stems, each of them being bent at an angle of approximately 90° at its lower end. One contact element according to the invention is fastened to each of the bent ends. The two stems are relatively slidable in such a manner that the opposite contact elements may be moved toward each other or away from each other. The two preferably plane contact areas are arranged so as to be congruent when the clamp is closed. The areas are preferably pushed against each other by the force of the spring.

The method according to the invention serves for supplying electric current to the board-shaped objects, at least one current-carrying contact element according to the invention being printed on the surfaces of the objects, thereby generating a flow of current between the contact elements and the objects.

The contact element according to the invention permits to henceforth transmit even large currents of 40 to 160 A for example to the printed circuit boards by means of one single contact organ of the invention which is provided with at least one such contact element. As contrasted with the methods utilizing the conventional contact elements, the surface areas of the copper which are printed on the contacting spots on the surfaces of the objects to be processed are not damaged even when very large currents are utilized. Thus, a current of, e.g., 60 A, and of course a current of less than 60 A as well, can be transmitted to the copper surfaces of a printed board material plated with a copper coating of 6 $\mu$m for example, without having the surface areas adjacent to the contacting spots noticeably damaged, e.g., worn off while forming a black cinder. On utilizing still thinner coatings of copper on the printed board material, e.g., coatings of a thickness of 0.7 $\mu$m for example, the problems mentioned may occur with considerably smaller currents when using the devices of the art. With the contact elements in accordance with the invention the damage described on these materials cannot even be observed with a flow of current of 40 A for example.

On examining with care the problems occurring with the prior art devices, it could be observed that the contacting spots on the surfaces of the printed circuit boards were in parts greatly damaged or completely destroyed. In some cases even, the resin layers of the base material lying underneath the copper coating were laid bare and partially blackened and damaged. In most cases, the damages were not limited to the very contact areas, they rather extended over greater areas so that the surface areas of the printed circuit boards in which the land patterns would have had to be formed were damaged as well.

These observations led to the assumption that despite the surrounding liquid for treatment, the material, at its border area between the contacting spot on the surface of the printed circuit board and the contact spot on the contact organs, on the clamps for example, is carried to a high temperature while current is being passed through, thus bringing about the damages mentioned. With the conventional contact organs, the generated heat could not be dissipated efficiently with appropriate expenditure. Since the contact organs have to be made of a chemically very resistant material, titanium is preferably used. This material has the disadvantage that its thermal conductivity is bad. It is not possible to have copper, which has a better conductivity, substituting for titanium, due to the want of chemical resistance of copper since copper disintegrates during the subsequent stripping process conducted on the clamps.

Improvement was obtained by increasing the force used to print the contact spots on the surfaces of the printed circuit board. In so doing, the damages mentioned to occur to the layer of copper and to the insulating material could be reduced. The increased forces however made it difficult to open and close the contacts, so that this solution proved to be unsatisfactory. Customary contact forces are of 10 to 30 N. Furthermore, on account of the existing tendency to reduce the coating thickness of copper on the outer sides of the printed circuit boards, the contact force cannot be increased ad lib. Very thin copper layers in particular, such for example having a thickness of 0.7 $\mu$m, are very sensitive and are damaged or destroyed, thereby possibly shorn off, by very large contact forces. As a result thereof, the flow of current is hampered or even interrupted.

The solution found out to eliminate the foregoing problems involves increasing the contact area of the contact spots. This approach is only successful though when the area available on the galvanoedge is large enough. On account of the now existing tendency to keep its width as small as possible in order to minimize this useless area portion of the printed board material, this alternative proved to be unsuitable for execution.

In a manner in accordance with the invention, by contrast, the length of the boundary line between the contact areas of the contact elements, the corresponding contacting areas on the board-shaped objects and the surrounding liquid for treatment is increased relative to the contact area.

Therefore, contact elements according to the invention are preferably provided with contact areas which are limited by boundary lines, the shape of the contact areas being designed in such a way that the ratio V of the square of the overall length L of all boundary lines to the size F of all the contact areas $$V = \frac{L^2}{F}$$

is at least 25, preferably at least 30 and in particular at least 35. The contact areas are preferably essentially plane.

The boundary line delimits a contact area which is preferably essentially plane. It demarcates at the same time the transition of the contact element to the surrounding liquid for treatment and to the surface of the object on which the contact element is printed. When using contact elements whose contact areas pass over to the lateral areas via rounded edges, the boundary lines are determined by the transitions between the contact element, the liquid for treatment and the surface of the object. In this case too, the boundary lines constitute the outer demarcation of the preferably substantially plane contact areas.

The contact element may be provided with at least two humps for example which are separated by intervals and which have one contact area each, said contact areas being preferably substantially plane (two-dimensional). The contact areas lie substantially in one plane and are arranged in such a manner that electrical contact can be made among all the contact areas and their corresponding contacting areas on the printed circuit boards. To this purpose the contact areas are customarily printed on the galvanoedge of the printed circuit boards by means of a contact force.

In another preferred embodiment the contact element may be provided with at least one contact area, the preferably substantially plane contact area assuming a shape which is an appropriate variation of simple two-dimensional geometric figures for prolonging the boundary line as compared to the boundary line in a conventional contact element. The contact area can be star-shaped, trifoliate or dumbbell-shaped. Other shapes having a prolonged boundary line are conceivable, irregular shapes for example. Such two-dimensional shapes are preferably provided with bight portions on their periphery. The periphery may also be provided with notches resembling saw teeth for example.

The inventive embodiments of the contact element have the advantage desired. The reason why this is so is not known, though. But it has been assumed that the selected arrangement allows better cooling of the contact spots and a more uniform supply of large currents, to very thin layers of metal in particular. On account of the longer boundary line, the current density flowing at the transition between the contact spots and the work is lower. Normally, the current flowing through the contact spots on the surfaces of the printed circuit boards considerably heats the material. It is possible that it is this rise in temperature that occasions the damage or destruction caused to the printed board material. By having the inventive contact elements provided with several humps fitted with contact surfaces separated by intervals or by giving the contact areas regular or irregular geometrical shapes, the liquid for treatment is better capable of contributing to cool the contact spots than in the case with the contact elements of the prior art which have undivided or simple geometrical shapes. To this end, the electrolyte penetrates into the intervals between the humps and the surface of the printed circuit board or between the bight portions on the periphery of the contact element, thus dissipating more efficiently the heat generated. In the case of the prior art contact elements, by contrast, the liquid for treatment washes the monolithic contact spots merely at the uniformly shaped outer side so that, in this case, the cooling effect is clearly less efficient.

Furthermore, by executing the contact elements in a preferred way with preferably substantially plane contact areas, a more intimate electrical contact is achieved than with prior art devices thanks to the fact that the elements rest better on the surface of the printed circuit board. As a result, the transition resistance and hence the development of heat at the contact spots may be considerably reduced. Moreover, sensible, very thin coatings of copper are thus prevented from being damaged since the local pressure on the surfaces is smaller.

In a particularly preferred embodiment of the contact elements, the humps have a section which is essentially circular and parallel to the plane in which the contact areas are lying. The humps may be cylindrical or conical, their cross section tapering toward the contact areas.

The number of humps is preferably even. In this case, they may be arranged in rows. Six, eight or ten such humps may be arranged in two rows for example, two humps at a time directly opposing each other or the humps of the two rows being staggered. It goes without saying that other arrangements of such humps with a substantially circular cross section and their combinations can be realized, they may, e.g., have a toothed outside surface and/or be configured in a matrix of three by three or four by four contact spots. Four humps may in particular be provided and be arranged in such a way that the respective contact areas are arranged at the corners of a square, a parallelogram or a trapezoid. Another possibility consists in giving the hump a cross section which departs from the circular shape and which is elliptical or quadrilateral (square or rectangular).

In another embodiment according to the invention, at least one interval is provided between the humps, said interval being shaped like a groove. The humps may be formed from one contact spot having a circular surface by fitting it with several grooves, which are cut there into for example. The thus formed grooves subdivide the circular surface into several contact areas which have the shape of a segment of a circle and are possibly toothed, the grooves particularly intersecting the center of the circular surface to this effect. If for example two intervals are provided in the form of right-angled grooves, the circular surface is subdivided into four equally sized contact areas having the shape of a segment of a circle. Another improvement may be achieved when the flow of the liquid for treatment against the contact elements is strong, which increases material transfer and cooling. The embodiments described herein above considerably improve the effect of the liquid flow.

The contact element is preferably made from an electrochemically resistant metal, e.g., from titanium, niobium, tantalum or from alloys of these metals or of other metals. By utilizing said materials, further protection of the contact organs against chemical attack by the liquid for treatment may be relinquished on principle.

It may be advantageous however to almost entirely sheathe the contact elements with insulating material, e.g., with a protective lacquer, in order to prevent them from being coated with metal during operation. The contact areas alone have to remain free from insulating material in order to be able to ensure perfect contacting of the printed circuit boards.

Since in most cases the contact spots are stripped again once they passed through a plating chamber, metal deposited on the remaining surfaces of the organs is also removed in the stripping process. Accordingly, protective sheathing with the insulating material may be fundamentally relinquished.

In case the contact elements are not made from the above mentioned metals, which are relatively bad electrical conductors, but from copper for example, corrosion protection is necessary. Since in many cases copper is not stable enough to a chemical attack of the liquids for treatment, the contact areas are coated with an electrically conductive, chemically resistant coating. Such coatings may preferably be made of gold, platinum, iridium, ruthenium, rhodium, alloys of these metals or mixed oxides.

BRIEF DESCRIPTION OF THE DRAWINGS

The invention will be explained in the following by reference to the FIGS. 1 through 6.

DETAILED DESCRIPTION OF THE PREFERRED EMBODIMENTS

Figure 1:
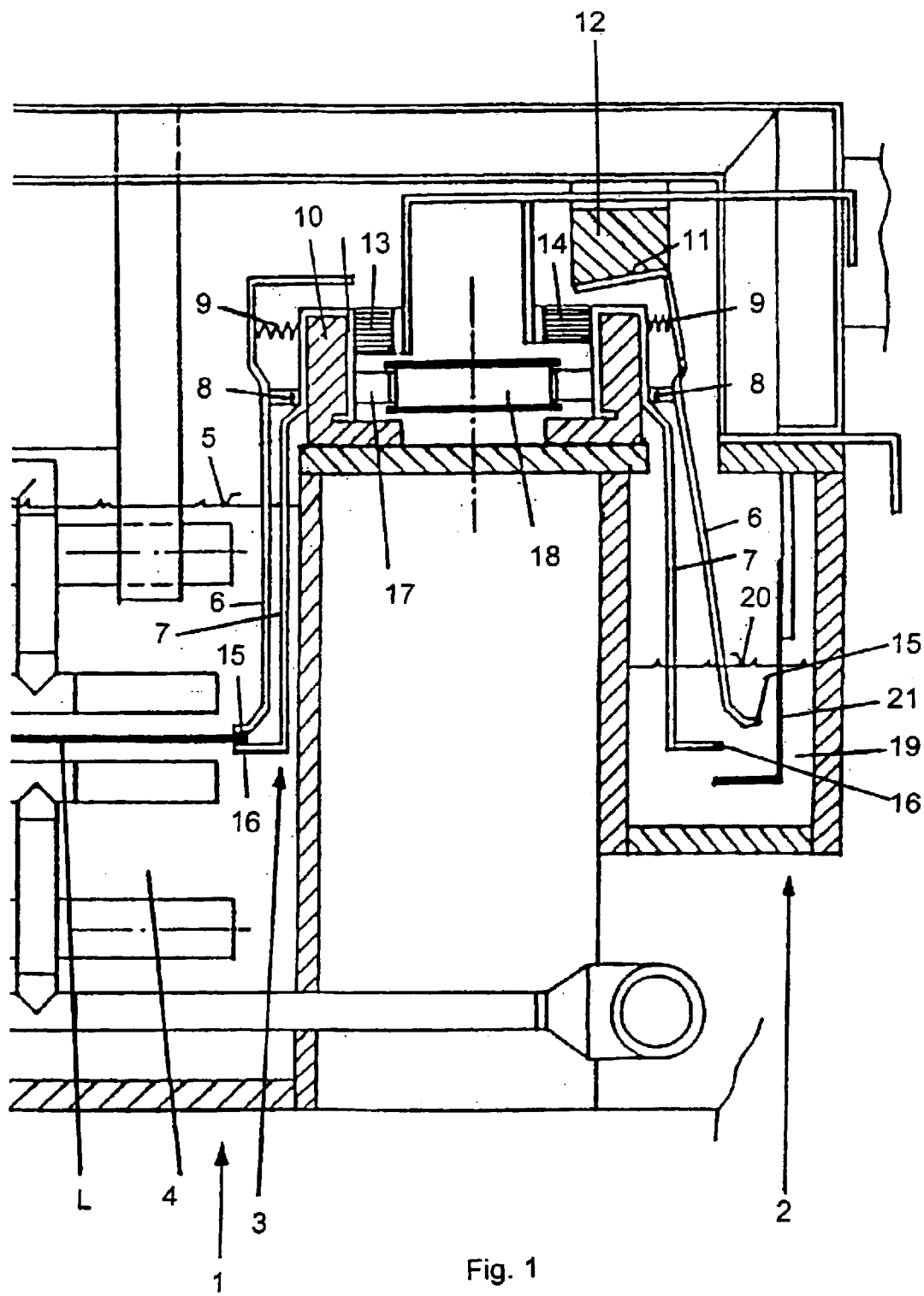
FIG. 1 shows a portion of an electroplating plant for printed circuit boards.

FIG. 1 shows a section through a portion of an electroplating plant for printed circuit boards with a plating section 1 and a stripping section 2. As far as the structure of the plant does not refer to the contact elements 15, 16 in accordance with the invention, said structure is basically known.

The printed circuit boards L are guided in one conveying plane through the plating section 1 by means of appropriate guide members (not shown). They are horizontally oriented in the process and are conveyed in horizontal direction (normal to the plane of the Figures). The guide members usually employed are rolls.

To advance the printed circuit boards L, the contact organs 3, which also serve for making electrical contact with the printed circuit boards L, are employed, said contact organs being designed as clamps in this case. Such clamps 3 may also be provided on the opposite edge of the printed circuit boards L, so that the plates may be grasped and advanced on both sides (exterior to the partial view in the Figure).

The clamps 3 are made of titanium, thus being resistant to the etching liquid for treatment 4. The printed circuit boards L are carried in the electroplating solution 4 (liquid level 5) in such a manner that they are completely surrounded by liquid. Usually, printed circuit boards are treated that are provided with a base layer of copper on both sides so that the current has to be supplied to both sides. The stripping section 2 includes a stripping solution 19 suitable for stripping the clamps 3 with the upper liquid level 20 as well as a counter electrode 21.

The contacting clamps 3 are driven by an endless chain or by an endless cog belt 17, made from synthetic material for example, and are closely spaced in rows one behind the other, the intervals between them amounting to 6 cm for example. The cog belt is guided by way of rolls 18. The clamps 3 are guided on a guide rail 10 by way of an internal clamp bar 7 which encompasses said rail. The clamps 3 are thus passed through the plating section 1 first, and then through the stripping section 2.

The clamps 3 consist of two clamp bars 6, 7, which are joined together at the pivot 8 so that the external bar 6 may be pivoted toward the internal bar 7 against a force provided by the pressure spring 9. The pressure spring 9 is supported between the two bars 6 and 7 above the pivot 8. In its idle position, the pressure spring 9 pushes the bars 6, 7 against each other, so that the clamp 3 is closed. This is the case when the clamp 3 is guided in the plating section 1. When the clamp 3 exits the plating section 1, the external bar 6 comes into contact with the stop face 11 of a stop rail 12, which compels the clamp to open against the force of the spring. The clamp 3 being opened, the printed circuit board L is released and can exit the plant. On returning, the bar 6 continues to be in contact with the stop face 11 so that the clamp 3 remains open.

Sliding contacts 13, 14 feed the electric current to the clamps 3. To this purpose, the internal bar 7 slides along the sliding contacts 13, 14. In the plating section 1 cathodic polarity is imposed upon the contact 13 whereas anodic polarity is imposed upon the sliding contact 14 in the stripping section 2.

Upon entering the plating section 1, the clamps 3 grasp the printed circuit boards L, which are entering said section as well, in the area of the galvanoedge. The spring 9 applies a force of 10 to 30 N onto the contact elements 15, 16 so that a very strong mechanical bond is achieved between the clamp 3 and the printed circuit board L. When the clamps 3 exit the stripping section 2, the external bar 6 runs off the stop face 11, thus allowing the clamp 3 to close. The end of the stop rail 12 with its stop face 11 is positioned in such a way that the closing clamp 3 is capable of grasping a printed circuit board L entering the plant at this place. Depending upon the size of the printed circuit boards L and the spacing between the clamps 3, four to eight clamps may grasp one printed circuit board at the same instant of time.

While the printed circuit boards L are grasped by the clamps 3, cathodic polarity is imposed upon the boards which are fed with electric current by the sliding contacts 13 and the clamps 3. After the opened clamps 3 have exited the plating section 1, they enter the stripping section 2. There, the contact 14 and the clamps 3 impose anodic polarity upon them and supply them with electric current. Thanks to anodic polarity, metal that deposited on the clamps 3 during the electroplating process in the plating section 1 can be stripped off in the stripping section 2.

Upper contact elements 15 and lower contact elements 16 in accordance with the invention are disposed at the tips of the contact bars 6, 7 for transmitting large currents. Said contact elements 15, 16 are strongly printed on corresponding locations on the surface of the printed circuit board L.

Figure 2:
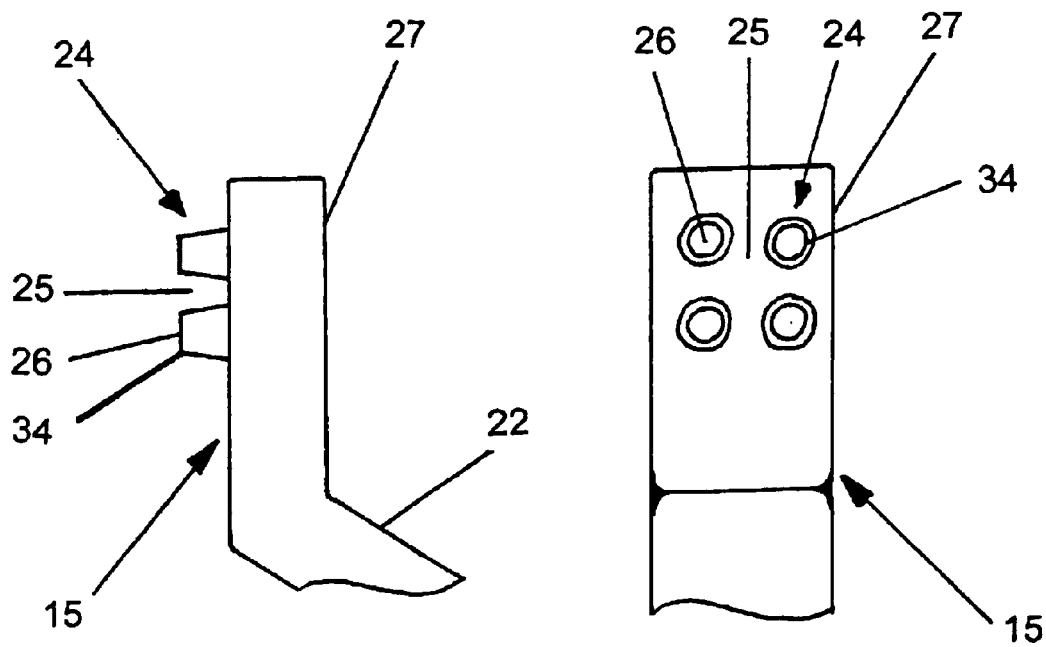
FIG. 2 shows a first embodiment of a contact element.

A first embodiment of a contact element 15 according to the invention is shown in FIG. 2. The contact element 15 is fastened to the stem 22 of the external clamp bar 6. The contact element 16 (not here presented) is fastened to the stem 23 of the internal clamp bar 7 in like manner. The contact elements 15, 16 substantially consist of a contact foot 27 and of the humps 24 fastened there onto with intervals 25 provided in between. Four humps 24 are provided in this embodiment, said humps being arranged on the corners of a square. On one side the contact humps 24 are provided with contact areas 26 which are delimited by the boundary line 34. On closing the clamp 3, the contact areas 26 are printed, i.e. pressed, very strongly on corresponding contacting areas on the surfaces of the printed circuit boards. The planarity of the contact areas 26 permits to achieve an intimate electrical contact with very little contact resistance between the contact areas of the humps 24 and the surfaces of the printed circuit boards. The humps 24 are made from copper for making good electrical contact. In order to achieve sufficient corrosion resistance for the humps 24 to the liquid for treatment, their copper top surface is plated with a thick enough layer of gold. Alternatively, other noble metals or electrically conductive mixed oxides may be employed as a protective coating.

By providing intervals 25 between the humps 24, the liquid for treatment can wash said humps 24 even when the contacts 15, 16 firmly rest on the printed circuit boards L. As a result thereof probably, efficient cooling of the contacts 15, 16 is achieved so that the surfaces of the printed circuit boards are not damaged through overheating.

Figure 3:
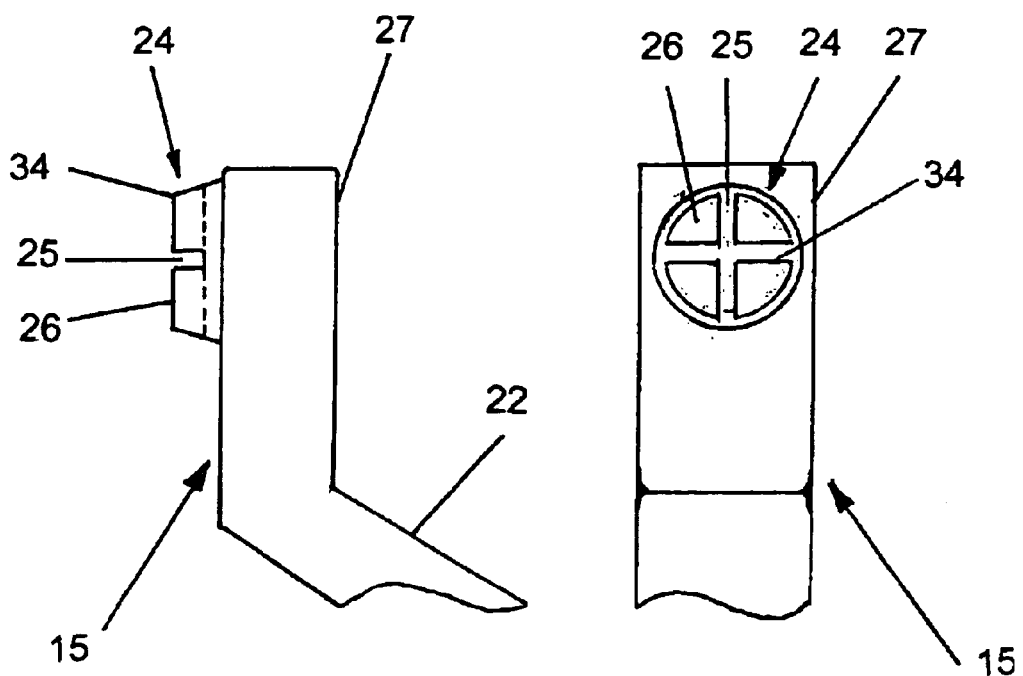
FIG. 3 shows a second embodiment of a contact element.

A second embodiment of the contacts is illustrated in FIG. 3. In this case too, the contact elements 15 (16 not shown) consist of the contact foot 27 and of the humps 24 arranged on said contact foot 27. In this case, the humps 24 are produced out of a circular surface in which grooves 25 are cut, which form the intervals between the humps 24. In this case there are two right-angled grooves 25 which subdivide the originally circular surface into four symmetrically arranged humps 24, each having the shape of a segment of a circle. In this case as well the various humps 24 are provided on one side with contact areas 26 which are delimited by the boundary line 34.

Figure 4:
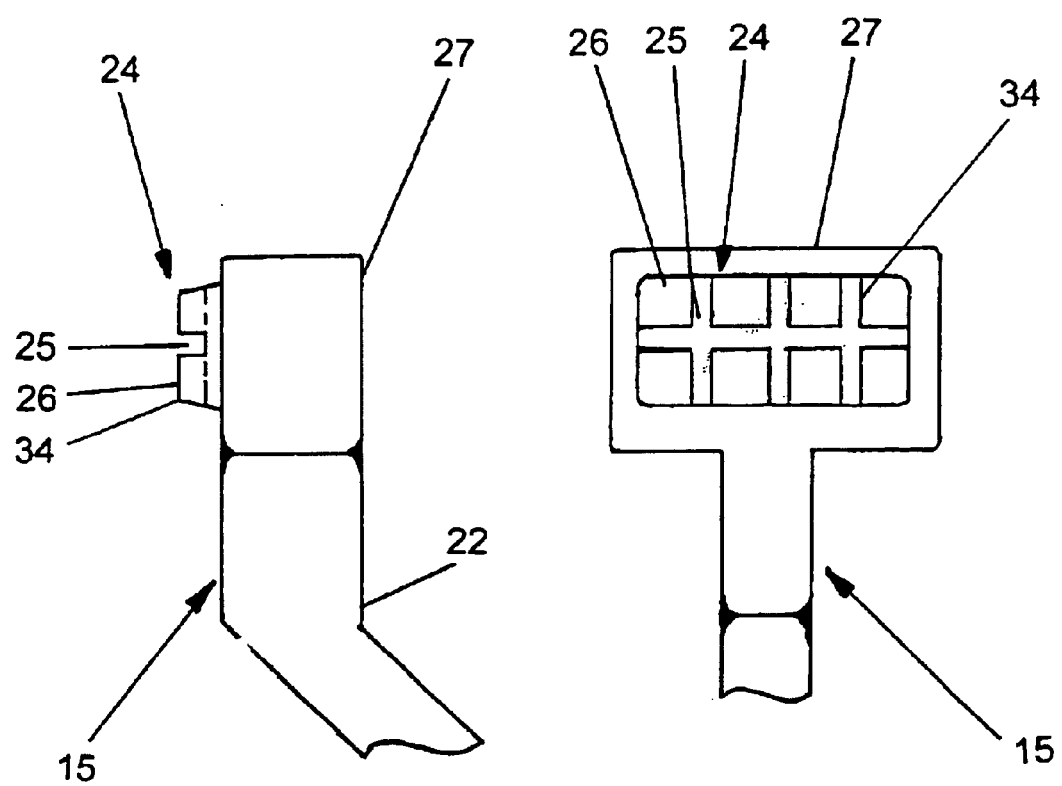
FIG. 4 shows a third embodiment of a contact element.

FIG. 4 indicates a third embodiment for the contacts. In this case, the contact foot 27 of the contact elements 15 (16 not shown) has an elongate shape. The various humps 24 are arranged in a row-shaped matrix and are produced by cuttings that simultaneously form the intervals (grooves) 25. The humps 24 are again provided on one side with plane contact areas 26 which are delimited by the boundary line 34.

The elongate shape of the hump arrangement allows a large supporting surface to be formed on a very narrow galvanoedge, a large enough contact surface F being available at the same time. As a result, the width of the useless galvanoedge may be further reduced.

The embodiments of FIGS. 2–4 are illustrative of embodiments of the present invention wherein the shape of the contact areas 26 is designed in such a way that the ratio V of the square of the overall length L of all boundary lines 34 to the size F of all the contact areas 26 as given by the expression:

$$V = \frac{L^2}{F}$$

is at least 25, preferably at least 30 and in particular at least 35.

Figure 5:
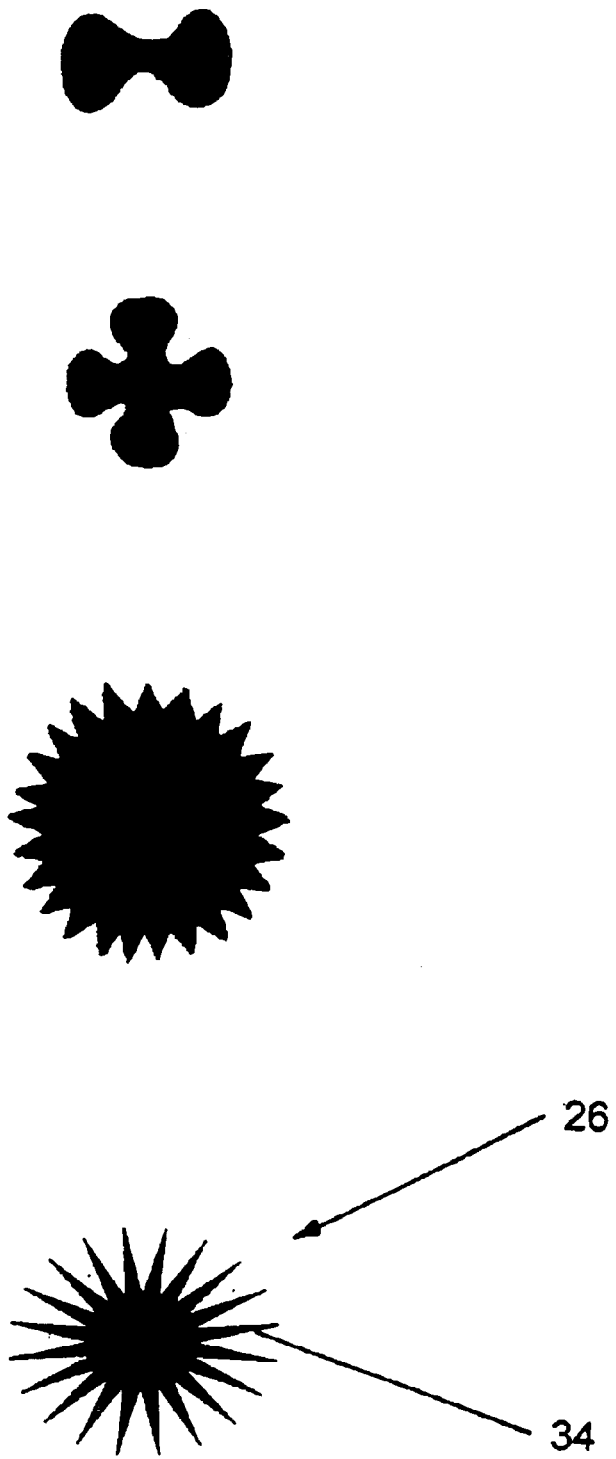
FIG. 5 shows various contact surfaces of other embodiments.

FIG. 5 shows further embodiments for geometrical shapes of contact surfaces 26. Each contact surface 26 is delimited by one boundary line 34. Stars, trifoliate or dumbbell-shaped shapes may be utilized. Furthermore, contact elements 26 may be used which have one or several serrated circles serving as contact areas 26.

The embodiments of FIG. 5 are illustrative of embodiments of the present invention wherein the shape of at least one contact area 26 of the contact element is designed in such a way that the ratio V of the square of the overall length L of the boundary lines 34 of the at least one contact area 26 to the size F of the at least one contact area 26 as given by the expression:

$$V = \frac{L^2}{F}$$

is at least 25, preferably at least 30 and in particular at least 35.

The contact areas 26 are preferably essentially plane.

Figure 6:
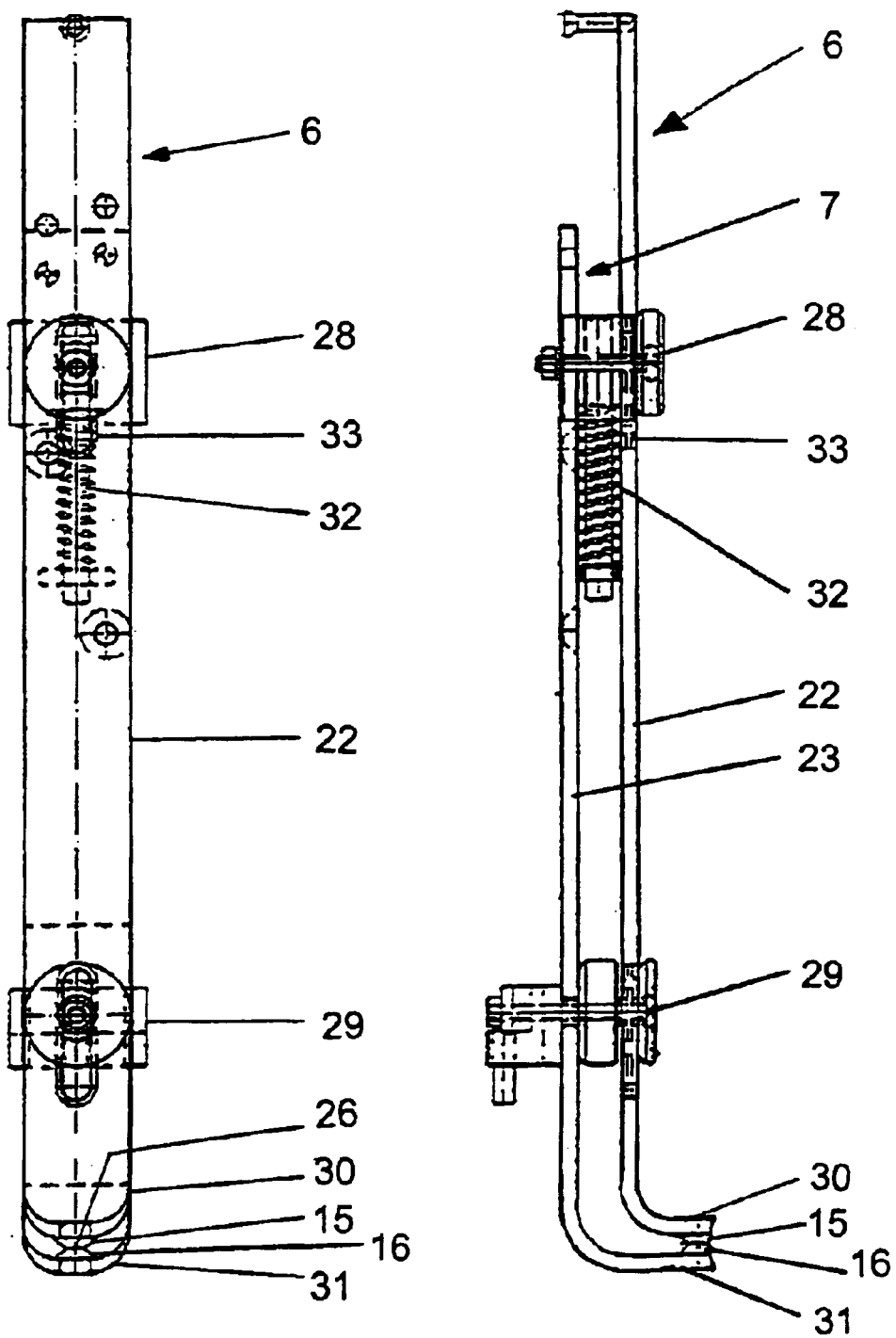
FIG. 6 shows a contacting clamp.

FIG. 6 illustrates an alternative embodiment of a contacting clamp 3, the inventive contact elements 15, 16 being fastened to both bars 6, 7 of said clamp. In this case, two paralleled bars 6, 7 are provided. The external bar 6 is connected to the internal bar 7 in such a way that both are relatively slidable parallel to their longitudinal axis. The upper end of the internal bar 7 is designed in such a way that it may be guided on a guide rail, in a fashion as shown in FIG. 1 for example (guide rail 10). In this case, the stem 22 of the external bar 6 is guided in the sliding bearings fastened to the stem 23 of the internal bar 7 in sliding bearing bodies 28, 29 through a long hole 33 so that it is movable parallel to the longitudinal axis of the stem. The lower ends of the two bars are inclined at an angle of about 90° at different heights but in the same direction. The contact elements 15, 16 are arranged at the ends of the bent arms 30, 31.

The pressure spring 32 pushes the two arms 30, 31 against each other. The spring 32 is supported by the stationary internal bar 7 via the upper sliding bearing body 28 and by a projection (not shown) fastened to the external bar 6.

The parallel motion of the external bar 6 relative to the internal bar 7 allows the contact areas 26 of the contact elements 15 and 16 to meet in a perfectly parallel arrangement so that an optimal contact of the contact areas 26 to the surfaces of the printed circuit board L may be achieved, said printed circuit board being oriented in such a way as to also be parallel to the contact areas 26.

What is claimed is:

1. Contact element for supplying electric current to substantially board-shaped objects that are to be treated in an electrolytic process, the board-shaped objects each having an electrically conductive surface, the contact element comprising:

one or more contact areas, at least one of said one or more contact areas having a shape configured in such a way that no damages occur in areas of the electrically conductive surface adjacent to said at least one of said one or more contact areas contact areas when large currents are transmitted from said contact element to the electrically conductive surface at least in part through said at least one of said one or more contact areas contact area placed in contact with the electrically conductive surface, said at least one of said one or more contact areas being bounded by a single closed boundary line, the shape of said at least one of said one or more contact areas being designed in such a way that the ratio V of the square of the overall length L of said single closed boundary line to the size F of said at least one of said one or more contact areas as given by the expression:

$$V = \frac{L^2}{F}$$

is at least 25.

2. Contact element according to claim 1, wherein the contact element is provided with at least two humps which are separated by intervals and which have one contact area each, said contact areas lying substantially in one plane and being arranged in such a manner that electrical contact can be made among all the contact areas and their corresponding contacting areas on the objects.

3. Contact element according to claim 2, wherein the humps have a toothed outside surface.

4. Contact element according to one of the claims 2 and 3, wherein the number of humps is even, the humps being arranged in rows.

5. Contact element according to claim 4, wherein four humps are provided and arranged in such a way that the respective contact areas are arranged at the corners of a square, a parallelogram or a trapezoid.

6. Contact element according to claim 2, wherein at least one of said intervals is provided which is shaped like a groove.

7. Contact element according to claim 1, wherein said at least one contact area is star-shaped, trifoliate or dumbbell-shaped.

8. Contact element according to one of the previous claims 1–3, 6 and 7, wherein the contact element is preferably made from titanium, niobium, tantalum or from alloys of these metals or of other metals.

9. Contact element according to one of the previous claims 1–3, 6 and 7, wherein the contact areas are substantially made of copper.

10. Contact element according to one of the previous claims 1–3, 6 and 7, wherein the contact areas are coated with an electrically conductive, chemically resistant coating of gold, platinum, iridium, ruthenium, rhodium, alloys of these metals or mixed oxides.

11. Contact organ for supplying electric current to substantially board-shaped objects that are to be treated by an electrolytic process, the board-shaped objects each having an electrically conductive surface, the contact organ comprising:
at least one stem; and
at least one contact element, said at least one contact element being arranged at one end of said stem, said stem being movable with said contact element by way of a restoring force in such a way that said contact element can be pressed onto the electrically conductive surface of the board-shaped objects,
wherein said contact element has one or more contact areas, the shape of said one or more contact areas being configured in such a way that no damages occur in areas of the electrically conductive surface adjacent to the contact areas when large currents are transmitted from said contact element to the electrically conductive surface through said one or more contact areas placed in contact with the electrically conductive surface, at least one of said one or more each of said contact areas being bounded by a single closed boundary line, the shape of said at least one of said one or more contact areas being designed in such a way that the ratio V of the square of the overall length L of said single closed boundary line of said at least one of said one or more contact areas to the size F of said at least one of said one or more contact areas as given by the expression:

$$V = \frac{L^2}{F}$$

is at least 25.

12. Contact organ according to claim 11, wherein said at least one contact element is provided with at least two humps which are separated by intervals and which have one contact area each, all said contact areas lying substantially in one plane and being arranged in such a manner that electrical contact can be made among all said contact areas and the electrically conductive surface when said at least one contact element is pressed onto the electrically conductive surface.

13. Method for supplying electric current to substantially board-shaped objects that are to be treated by an electrolytic process, the board-shaped objects each having an electrically conductive surface, the method comprising the steps of:
providing at least one contact element, wherein the contact element has one or more contact areas, the shape of said one or more contact areas being configured in such a way that no damages occur in areas of the electrically conductive surface adjacent to said one or more contact areas when large currents are transmitted from the contact element to the electrically conductive surface through said one or more contact areas placed in contact with the electrically conductive surface, at least one of said one or more contact areas being bounded by a single closed boundary line, the shape of said at least one of said one or more contact areas being designed in such a way that the ratio V of the square of the overall length L of said single closed boundary line of said at least one of said one or more contact areas to the size F of said at least one of said one or more contact areas as given by the expression:

$$V = \frac{L^2}{F}$$

is at least 25;
pressing the at least one contact element on the electrically conductive surface; and
generating a flow of current between the contact element and the electrically conductive surface.

14. Contact element for supplying electric current to substantially board-shaped objects that are to be treated in an electrolytic process, the board-shaped objects each having a conductive surface, the contact element comprising:
one or more contact areas, said contact areas having a shape configured in such a way that no damages occur in areas of the conductive surface adjacent to said contact areas when large currents are transmitted from said contact element to the conductive surface through said contact areas placed in contact with the conductive surface, said contact areas being limited by boundary lines, the shape of said contact areas being designed in such a way that the ratio V of the square of the overall length L of all boundary lines to the size F of all the contact areas as given by the expression:

$$V = \frac{L^2}{F}$$

is at least 25, wherein the side faces of the contact element adjacent to the contact areas are exposed for cooling in such a way that the liquid for treatment may wash them, and
wherein several grooves are provided that subdivide a circular surface into several contact areas which have the shape of a segment of a circle, the grooves intersecting the center of the circular surface.

15. Contact element according to claim 14, wherein two grooves are provided which are arranged perpendicularly to one another and which subdivide the circular surface into four equally sized contact areas having the shape of a segment of a circle.

* * * * *